(12) United States Patent
Buis et al.

(10) Patent No.: US 7,700,930 B2
(45) Date of Patent: Apr. 20, 2010

(54) LITHOGRAPHIC APPARATUS WITH ROTATION FILTER DEVICE

(75) Inventors: Edwin Johan Buis, Belfeld (NL); Tjarko Adriaan Rudolf Van Empel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 277 days.

(21) Appl. No.: 11/898,800

(22) Filed: Sep. 14, 2007

(65) Prior Publication Data

US 2009/0073401 A1    Mar. 19, 2009

(51) Int. Cl.
 *G21K 5/10*    (2006.01)
(52) U.S. Cl. .............. 250/492.2; 250/492.1; 250/492.3; 250/398; 250/400; 250/396 R
(58) Field of Classification Search ............. 250/398, 250/400, 492.1, 492.2, 492.21, 492.22, 492.3
See application file for complete search history.

(56) References Cited

U.S. PATENT DOCUMENTS

| 4,833,030 A | 5/1989 | Petersen ............ 428/408 |
| 2005/0151305 A1 | 7/2005 | Siegel et al. ............ 264/640 |
| 2006/0019816 A1 | 1/2006 | Lynen et al. ............ 501/90 |
| 2006/0151717 A1* | 7/2006 | Klunder et al. ........ 250/492.2 |
| 2006/0186353 A1 | 8/2006 | Wassink ............ 250/492.2 |

FOREIGN PATENT DOCUMENTS

| EP | 1 274 287 A1 | 1/2003 |
| EP | 1 434 098 A2 | 6/2004 |
| WO | WO 99/42904 | 8/1999 |
| WO | WO 00/34629 | 6/2000 |
| WO | WO 03/034153 A2 | 4/2003 |

* cited by examiner

*Primary Examiner*—Jack I Berman
*Assistant Examiner*—Hanway Chang
(74) *Attorney, Agent, or Firm*—Pillsbury Winthrop Shaw Pittman, LLP

(57) ABSTRACT

A lithographic apparatus including a filter device is disclosed. The filter device has a plurality of foils attached to a holder which is able to rotate around a rotation axis. The foils are arranged substantially parallel to the rotation axis. The foils comprise a uni-directional carbon-fiber composite material selected from the group consisting of carbon-carbon composite (C-C composite) and carbon-silicon carbide composite (C—SiC composite). During operation, the filter device rotates and filters out debris from a radiation source, such as a Sn plasma source. Such a filter device per se may be provided.

22 Claims, 5 Drawing Sheets

LITHOGRAPHIC APPARATUS WITH ROTATION FILTER DEVICE

FIELD

The present invention relates to a lithographic apparatus with a special filter device, to the filter device per se, to a method for the production of such filter device and to a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or antiparallel to this direction. It is also possible to transfer the pattern from the patterning device to the substrate by imprinting the pattern onto the substrate.

In a lithographic projection apparatus, the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multilayer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector or collector mirror. The purpose of the collector is to collect radiation which is emitted in all directions by the plasma source and direct it towards other mirrors in the illumination system. The radiation collector is positioned very close to, and in line-of-sight with, the source of EUV in the plasma source and therefore receives a large flux of fast particles from the plasma. Other mirrors in the system are generally damaged to a lesser degree by sputtering of particles expelled from the plasma since they may be shielded to some extent.

In the near future, extreme ultraviolet (EUV) sources will probably use tin (Sn) or another metal vapor to produce EUV radiation. This tin may be deposited on mirrors, e.g. a mirror of the radiation collector, and/or leak into the lithographic apparatus. A mirror of such a radiation collector may have a EUV reflecting top layer of, for example, ruthenium (Ru). Deposition of more than approximately 10 nm tin (Sn) on the reflecting Ru layer may reflect EUV radiation in the same way as bulk Sn. The overall transmission of the collector would decrease significantly, since the reflection coefficient of tin is much lower than the reflection coefficient of ruthenium.

PCT Patent Application Publication No. WO 99/42904 discloses a filter that is, in use, situated in a path along which the radiation propagates away from the source. The filter may thus be placed between the radiation source and, for example, the illumination system. The filter includes a plurality of foils that, in use, trap debris particles, such as atoms and micro particles. Also, clusters of such micro particles may be trapped by these foils. These foils are oriented such that radiation can still propagate through the filter. The foils may be flat or conical and may be arranged radially around the path. The source, the filter and the projection system may be arranged in a buffer gas, for example, krypton at a pressure of about 0.5 torr.

PCT Patent Application Publication No. WO 03/034153 discloses a contaminant barrier that includes a first set of foils and a second set of foils, such that radiation leaving the source first passes the first set of foils and then the second set of foils. The foils of the first and second set define a first set of channels and a second set of channels, respectively. The two sets of channels are spaced apart leaving between them a space into which flushing gas is supplied by a gas supply. An exhaust system may be provided to remove gas from the contaminant barrier.

European Patent Application Publication No. EP 1 434 098 provides a contaminant barrier that includes an inner ring and an outer ring in which each of the foils is slidably positioned at least one of its outer ends in grooves of at least one of the inner ring and outer ring. By slidably positioning one of the outer ends of the foils, the foils can expand in a radial direction. The contaminant barrier may include a cooling system arranged to cool one of the rings to which the foils are thermally connected.

In order to prevent debris from the source or secondary particles generated by this debris from depositing on an optical element, a filter device may be used, such as for instance described in United States Patent Application Publication No. US 2006/0186353.

SUMMARY

It is desirable, for example, to provide a lithographic apparatus with an alternative filter device, which filter device may be suitable for application in an EUV lithographic apparatus. It is also or alternatively desirable, for example, to provide such alternative filter device per se, a method for the production of such filter device, and/or a device manufacturing method.

According to an aspect of the invention, there is provided a lithographic apparatus comprising a filter device, the filter device comprising a plurality of foils attached to a holder able to rotate around a rotation axis, the foils being arranged substantially parallel to the rotation axis and comprising a uni-directional carbon-fiber composite material selected from the group consisting of a carbon-carbon composite and a carbon-silicon carbide composite.

In an embodiment, the lithographic apparatus comprises a source of radiation constructed to generate EUV radiation wherein the source of radiation is a Sn plasma source. Herein, the term "constructed to generate EUV radiation" refers to sources which are designed to generate EUV radiation and which are designed to be used in EUV lithography. In a variant, the source of radiation comprises a laser produced plasma source (LPP) or a discharge produced plasma source (Sn plasma source), respectively.

The lithographic apparatus comprises, in an embodiment, an illumination system configured to condition a radiation beam; a support constructed to support a patterning device, the patterning device configured to impart the radiation beam with a pattern in its cross-section to form a patterned radiation beam; a substrate table constructed to hold a substrate; and a projection system configured to project the patterned radiation beam onto a target portion of the substrate. In an embodiment, the lithographic apparatus is an EUV lithographic apparatus and comprises an EUV source of radiation to provide an EUV radiation beam. The lithographic apparatus may comprise a source of radiation constructed to generate the radiation beam, which in an embodiment is an EUV radiation beam, and the source of radiation is constructed to generate EUV radiation.

In an embodiment, the direction of the fibers in the carbon-fiber composite material is perpendicular to the rotation axis.

In an embodiment, the foils comprise one layer of uni-directional carbon-fiber composite material. In an embodiment, each of the foils comprises 2-5 layers of composite material. In the latter embodiment, the direction of the carbon fibers within the respective layer may differ from layer to layer.

In an embodiment, the foils comprise a first layer of uni-directional carbon-fiber composite material and a second layer of uni-directional carbon-fiber composite material, wherein the direction of the fibers in the first layer is perpendicular to the direction of the fibers in the second layer. In an embodiment, the foils comprise a first layer of uni-directional carbon-fiber composite material and a second layer of uni-directional carbon-fiber composite material, wherein the direction of the fibers in the first layer have a first direction angle $\theta 1$ relative to a normal perpendicular to the rotation axis and wherein the direction of the fibers in the second layer have a second direction angle $\theta 2$ relative to the normal, and wherein the first and the second direction angles $(\theta 1, \theta 2)$ are in the range of 0-10° and wherein the mutual angle between the direction of the fibers in the first layer and the second layer is larger than 0° and equal to or smaller than 10°.

In an embodiment, the holder comprises a plurality of sleeves, wherein each foil comprises a tail part, wherein the sleeves are constructed to receive the tail parts, and wherein the sleeves are constructed to prevent release of the foils from the holder in a direction perpendicular to the rotation axis.

In an embodiment, at least part of the holder may comprise a carbon-fiber composite material selected from the group consisting of carbon-carbon composite (C—C composite) and carbon-silicon carbide composite (C—SiC composite). In an embodiment, the holder may comprise uni-directional carbon-fiber composite material.

According to a further aspect of the invention, there is provided a lithographic apparatus comprising a filter device, the filter device comprising a plurality of foils attached to a holder which is able to rotate around a rotation axis, the foils being arranged parallel to the rotation axis and comprising a material which does not substantially react with liquid Sn at a temperature of at least 1000° C. In an embodiment, the material does not substantially react with liquid Sn at a temperature up to about 2000° C.

According to a further aspect of the invention, there is provided a device manufacturing method using a lithographic apparatus according to an embodiment of the invention. In aspect, there is provided a device manufacturing method, comprising: patterning a beam of radiation; projecting the patterned beam of radiation onto a target portion of a substrate; and filtering the beam of radiation using a filter device, the filter device comprising a plurality of foils attached to a holder able to rotate around a rotation axis, the foils being arranged substantially parallel to the rotation axis and comprising a uni-directional carbon-fiber composite material selected from the group consisting of a carbon-carbon composite and a carbon-silicon carbide composite.

According to a further aspect of the invention, there is provided a filter device per se, the filter device comprising a plurality of foils attached to a holder which is able to rotate around a rotation axis, the foils being arranged substantially parallel to the rotation axis and comprising a uni-directional carbon-fiber composite material selected from the group consisting of carbon-carbon composite and carbon-silicon carbide composite.

As mentioned above, in an embodiment, at least part of the holder, such as a holder upstream side, may comprise a carbon-fiber composite material selected from the group consisting of carbon-carbon composite (C—C composite) and carbon-silicon carbide composite (C—SiC composite).

In a further aspect, there is provided a method for the production of a foil for a filter device, the method comprising:
a. providing a resin containing pre-impregnated sheet;
b. curing the resin;
c. optionally reducing the thickness of at least part of the product obtained at b);
d. carbonizing the product obtained at b) or c);
e. optionally performing one or more times a densifying process, wherein the densifying process comprises infiltrating the carbonized product with a carbon-containing compound and subsequently carbonizing the infiltrated product;
f. graphitizing the product obtained at d) or e);
g. optionally reducing the thickness of at least part of the product obtained at f)

wherein the method comprises reducing the thickness by process c), or by process g), or by both process c) and g), and wherein the foil comprises a uni-directional carbon-fiber composite material selected from the group consisting of carbon-carbon composite and carbon-silicon carbide composite. The carbon-containing compound may be, for instance, a phenolic resin.

In an embodiment, the resin containing pre-impregnated sheet comprises a laminate of resin containing pre-impregnated sheets. In an embodiment, after the optional process c) and before process d) the method further comprises performing one or more times a laminating process, wherein the laminating process comprises:

a1. arranging a further resin containing pre-impregnated sheet to the product obtained at b) or c) to obtain a laminate of the product obtained at b) or c) and the further resin containing pre-impregnated sheet;
b1. curing the resin; and
c1. optionally reducing the thickness of at least part of the product obtained at b1).

A foil obtained with the method for production may be applied in the filter device of an embodiment of the invention.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
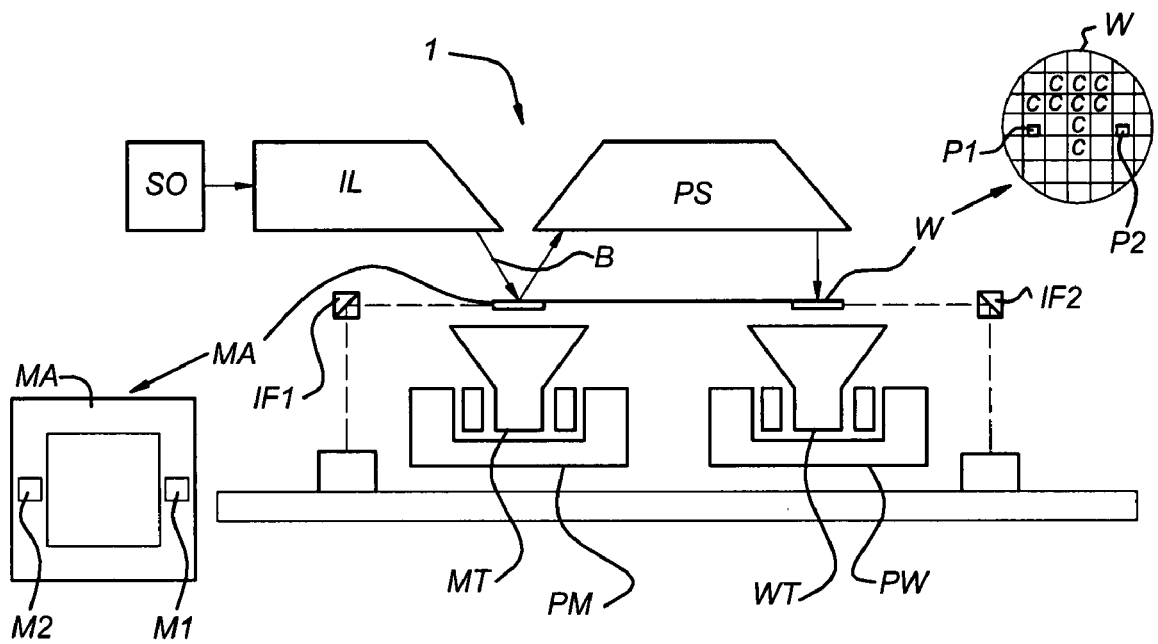
FIG. 1 schematically depicts a lithographic apparatus according to an embodiment of the present invention.

FIG. 1 schematically depicts a lithographic apparatus 1 according to an embodiment of the present invention. The apparatus 1 includes a source SO configured to generate radiation and an illumination system (illuminator) IL configured to condition a radiation beam B (e.g. UV radiation or EUV radiation) from the radiation received from source, SO. The source SO may be provided as a separate unit and not be a part of the lithographic apparatus. A support (e.g. a mask table) MT is configured to support a patterning device (e.g. a mask) MA and is connected to a first positioning device PM configured to accurately position the patterning device MA in accordance with certain parameters. A substrate table (e.g. a wafer table) WT is configured to hold a substrate (e.g. a resist-coated wafer) W and is connected to a second positioning device PW configured to accurately position the substrate W in accordance with certain parameters. A projection system (e.g. a reflective projection mirror system) PS (also known as projection optics box POB) is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support MT holds the patterning device in a manner that depends on the orientation of the patterning device, the design of the lithographic apparatus, and other conditions, such as for example whether or not the patterning device is held in a vacuum environment. The support MT can use mechanical, vacuum, electrostatic or other clamping techniques to hold the patterning device. The support MT may be a frame or a table, for example, which may be fixed or movable as required. The support MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more patterning device supports). In such "multiple stage" machines the additional tables and/or supports may be used in parallel, or preparatory steps may be carried out on one or more tables and/or supports while one or more other tables and/or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support (e.g., mask table) MT, and is patterned by the patterning device. Having traversed the patterning device MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

a. In step mode, the patterning device support MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

b. In scan mode, the patterning device support MT and the substrate table WT are scanned synchronously while a pattern imparted to the radiation beam is projected onto a target portion C (i.e. a single dynamic exposure). The velocity and direction of the substrate table WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

c. In another mode, the patterning device support MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

The terms "radiation" and "beam" used herein encompass all types of electromagnetic radiation, including ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm, e.g. 13.5 nm or 6.6 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. The person skilled in the art understands that radiation having a wavelength in the range of, for example, 5-20 nm relates to radiation with a certain wavelength band, of which at least part is in the range of 5-20 nm.

Figure 2:
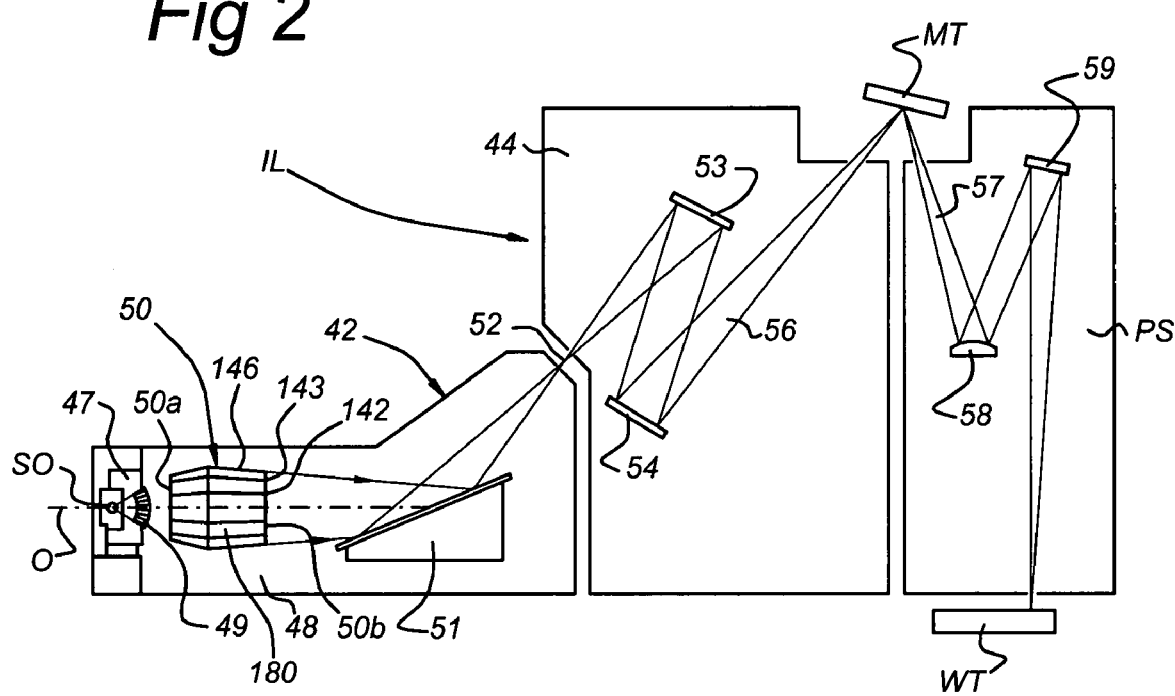
FIG. 2 schematically depicts a side view of an EUV illumination system and projection optics of a lithographic projection apparatus according to an embodiment of FIG. 1.

FIG. 2 shows the projection apparatus 1 in more detail, including a radiation system 42, an illumination system 44, and the projection system PS. The radiation system 42 includes the radiation source SO which may be a discharge plasma source. EUV radiation may be produced by a gas or vapor in the source, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. In an embodiment, a Sn source as EUV source is applied. The radiation emitted by radiation source SO is passed from a source chamber 47 into a collector chamber 48 via an optional contaminant barrier 49 which is positioned in or behind an opening in source chamber 47. The contaminant barrier 49 may comprise a channel structure. Contaminant barrier 49 may comprise a gas barrier or a combination of a gas barrier and a channel structure. The contaminant barrier 49 further indicated herein at least comprises a channel structure.

The collector chamber 48 includes a radiation collector 50 (herein also indicated as collector mirror) which may be formed by a grazing incidence collector. Radiation collector 50 has an upstream radiation collector side 50a and a downstream radiation collector side 50b. Radiation passed by collector 50 can be reflected off a grazing incidence mirror 51 to be focused in a virtual source point 52 at an aperture in the collector chamber 48. From collector chamber 48, a beam of radiation 56 is reflected in illumination system 44 via normal incidence reflectors 53, 54 onto a patterning device (e.g., a reticle or mask) positioned on patterning device support MT (e.g., a reticle or mask table). A patterned beam 57 is formed which is imaged in projection system PS via reflective elements 58, 59 onto substrate table WT. More elements than shown may generally be present in illumination system 44 and projection system PS. Grazing incidence mirror 51 may optionally be present, depending upon the type of lithographic apparatus. The grazing incidence mirror may be a grating spectral filter 51. Further, there may be more mirrors present than those shown in the Figures, for example there may be 1-4 more reflective elements present than elements 58, 59.

Instead of or in addition to a grazing incidence mirror as collector mirror 50, a normal incidence collector may be applied. Collector mirror 50, as described herein in an embodiment in more detail as a nested collector with reflectors 142, 143, and 146, and as schematically depicted in, for example, FIG. 2, is herein further used as an example of a collector (or collector mirror). Hence, where applicable, collector mirror 50 as a grazing incidence collector may also be interpreted as collector in general and in a specific embodiment also as a normal incidence collector.

Instead of or in addition to a grating spectral filter 51, as schematically depicted in FIG. 2, a transmissive optical filter may be applied that is transmissive for EUV and less transmissive for or even substantially absorbing of UV radiation. Hence, "grating spectral purity filter" is herein further indicated as "spectral purity filter" which includes gratings or transmissive filters. Not depicted in schematic FIG. 2, but also included as an optional optical element may be an EUV transmissive optical filter, for instance arranged upstream of collector mirror 50, or an optical EUV transmissive filter in illumination system 44 and/or projection system PS.

In an embodiment (see also above), radiation collector 50 may be a grazing incidence collector. The collector 50 is aligned along an optical axis O. The source SO or an image thereof is located on optical axis O. The radiation collector 50 may include reflectors 142, 143, 146 (also known as a Wolter-type reflector comprising several Wolter-type reflectors). These reflectors 142, 143, 146 may be nested and rotationally symmetric about optical axis O. In FIG. 2 (as well as in other Figures), an inner reflector is indicated by reference number 142, an intermediate reflector is indicated by reference number 143, and an outer reflector is indicated by reference number 146. The radiation collector 50 encloses a certain volume, i.e. the volume within the outer reflector(s) 146. Usually, this volume within outer reflector(s) 146 is peripherally closed, although small openings may be present. All the reflectors 142, 143 and 146 include surfaces of which at least part includes a reflective layer or a number of reflective layers. Hence, reflectors 142, 143 and 146 (more reflectors may be present and embodiments of radiation collectors 50 may have more than 3 reflectors), are at least partly designed for reflecting and collecting EUV radiation from source SO, and at least part of the reflector may not be designed to reflect and collect EUV radiation. For example, at least part of the back side of the reflectors may not be designed to reflect and collect EUV radiation. On the surface of these reflective layers, there may in addition be a cap layer for protection or an optical filter provided on at least part of the surface of the reflective layers.

The radiation collector 50 is usually placed in the vicinity of the source SO or an image of the source SO. Each reflector 142, 143, 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetrically about the optical axis O. It should be appreciated that radiation collector 50 may have further features on the external surface of outer reflector 146 or further features around outer reflector 146, for example a protective holder, a heater, etc. Reference number 180 indicates a space between two reflectors, e.g. between reflectors 142 and 143.

All optical elements shown in FIG. 2 (and optical elements not shown in the schematic drawing of this embodiment) are vulnerable to deposition of contaminants (for instance produced by source SO), for example, Sn. This is the case for the radiation collector 50 and, if present, the spectral purity filter 51.

Further, not only optical elements may be contaminated by deposition, such as Sn, but also construction elements such as walls, holders, supporting systems, gas locks, a contaminant barrier 49, etc. This deposition may not directly influence the optical properties of the optical elements, but due to re-deposition, this deposition may deposit (i.e. re-deposit) on optical elements, thereby influencing the optical properties. Hence, even deposition not deposited on optical elements may in a later stage due to re-deposition lead to contamination of surfaces of optical elements. This may lead to a decrease in optical performance like reflection, transmission, uniformity, etc.

During use, deposition may be found on one or more of the outer 146 and inner 142/143 reflector(s). The radiation collector 50 may be deteriorated by such deposition (deterioration by debris, e.g. ions, electrons, clusters, droplets, electrode corrosion from the source SO). Deposition of Sn, for example due to a Sn source, may, after a few mono-layers, be detrimental to reflection of the radiation collector 50 or other optical elements, which may necessitate the cleaning of such optical elements.

In order to diminish this deposition, a contaminant barrier 49 may be provided. In addition or instead to the contaminant barrier 49, a filter device may be provided as further discussed below. The contaminant barrier 49 is a static device, whereas the filter device according to an embodiment of the invention is a dynamic device, i.e. it is a rotating contaminant barrier, which may rotate during use of the lithographic apparatus.

Therefore, a filter device, especially suitable for application in an EUV lithographic apparatus, especially for EUV with plasma based Sn sources, is provided.

Figure 3:
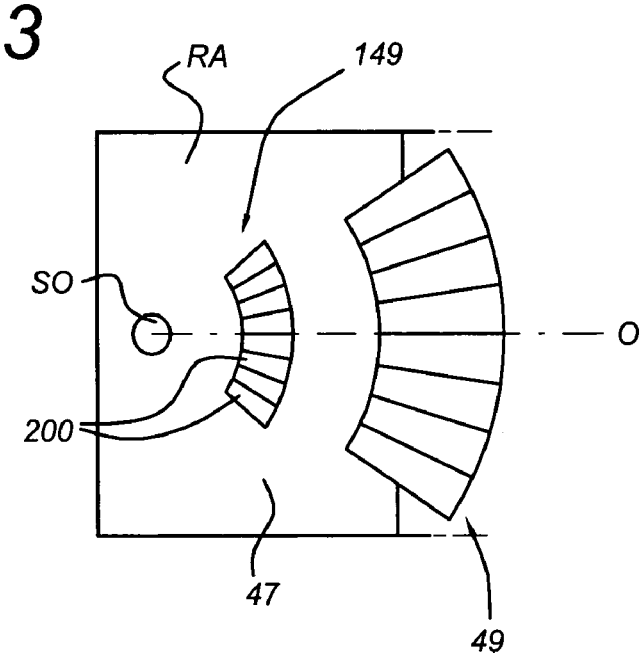
FIG. 3 schematically depicts a detail of an embodiment of the source chamber lithographic apparatus of FIGS. 1 and 2.

Referring to FIG. 3, the arrangement of the filter device 149 is schematically depicted. Source chamber 47 with source SO is depicted. Downstream from the source, the collector 50 is present (not depicted). Downstream from the source SO, but upstream from the collector 50, i.e. before the first (reflective) optics, optional contaminant barrier 49 is arranged, as described above. Further, downstream from source SO and upstream from the collector 50 (not depicted), and upstream from the optional contaminant barrier 49, filter device 149 is arranged. Schematically, a plurality of foils is depicted of the filter device 149 as further shown in FIG. 4.

Figure 4:
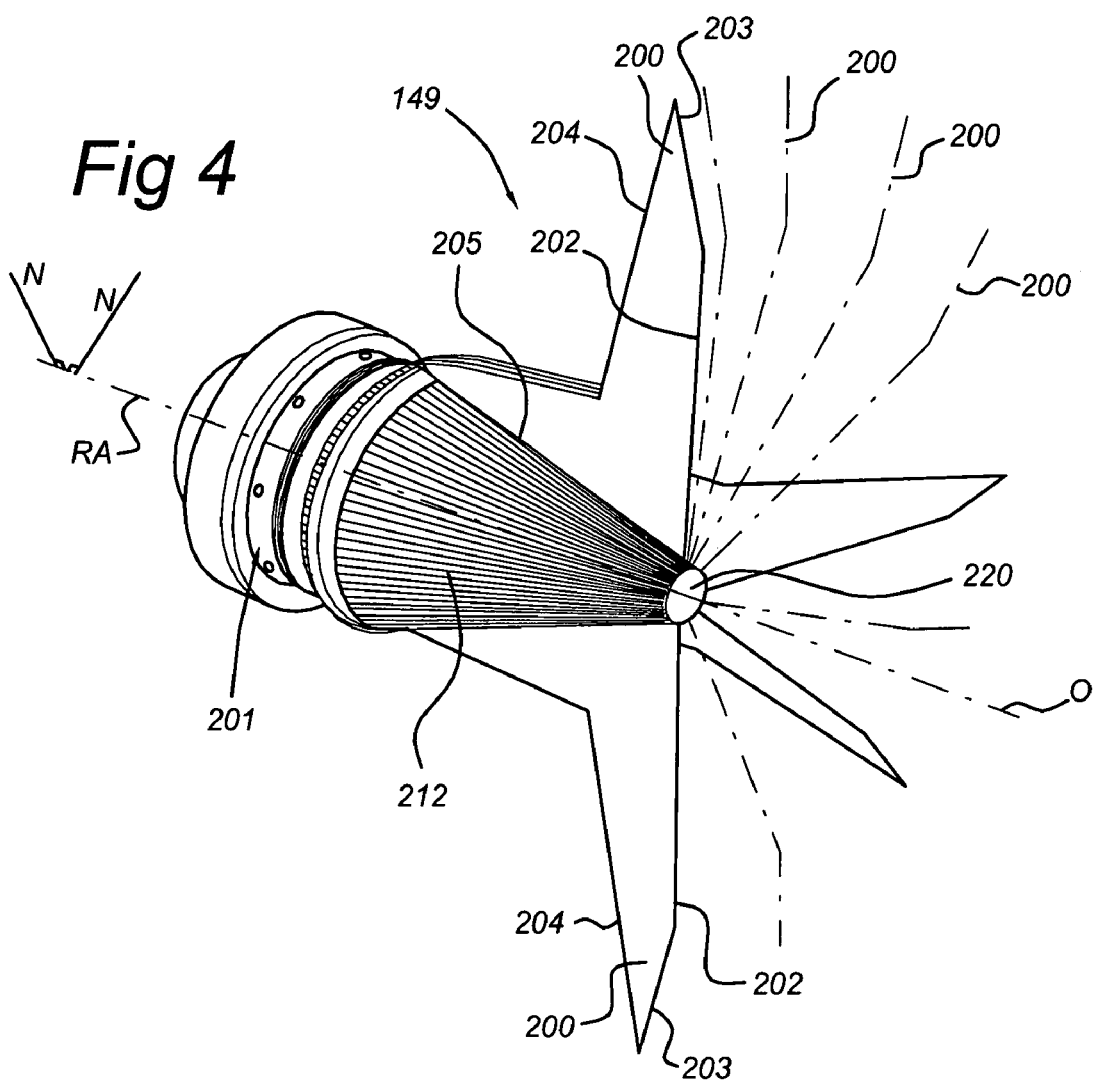
FIG. 4 schematically depicts a filter device according to an embodiment of the invention.

FIG. 4 schematically depicts the filter device 149 according to an embodiment of the invention. Only relevant details are shown; a filter device housing and a filter device motor to rotate the filter device 149 are for the sake of simplicity not indicated.

The filter device 149 comprises a holder 201, for example in the form of a cone, with holder upstream side 220 (here a cone top), and foils 200 (of which only a few are depicted for clarity). During use, the filter device 149 may rotate along a rotation axis RA. In an embodiment, the rotation axis RA is substantially parallel to and substantially coincides with at least part of the optical axis O (as shown in FIG. 4). In an embodiment, the filter device 149 is rotationally symmetric about rotation axis RA (and in a an embodiment thus also optical axis O). The holder upstream side 220 is directed to the source SO (not depicted). The foils 200 may have an upstream front region 202, a top region 203, a downstream back region 204 and a bottom 205.

The filter device 149 is a kind of "propeller" with foils 200 parallel to the rotation axis RA, e.g., parallel to and/or coinciding with the optical axis O. As seen in FIG. 4, the foils 200 are parallel to the rotation axis RA and are parallel to normals N perpendicular to the rotation axis RA. The planes of the foils intersect at the rotation axis RA.

The foils 200 may have a maximum foil thickness d (see FIG. 5) in the range of 0.05-1.2 mm, or 0.1-0.4 mm. At larger thickness, too much radiation may be blocked, and a lower thickness may not be feasible with the carbon-fiber composite material described hereafter. The filter device 149 may comprise about 50-200 foils, or 150-200 foils. During use (i.e. during lithographic processing), the filter device 149 may rotate about rotation axis RA with a speed in the range of about 1,000-20,000 rpm, or in the range of 3,000-8,000 rpm. The foils 200 are oriented such that at least part of the radiation from source SO can still propagate through the filter 149.

Specific embodiments are also described in PCT Patent Application Publication Nos. WO 99/42904 and WO 03/034153 and United States Patent Application Publication No. US 2006/0186353, which are incorporated herein in their entirety by reference.

The filter device 149 is faced with ions and particles and especially with Sn (tin) particles. The Sn particles may, when they reach the filter device, have a temperature of up to about 2000-2500° C. Very robust materials like W (tungsten) or Mo (molybdenum) are not able to cope with these conditions. Surprisingly however, carbon-fiber composite material selected from the group consisting of carbon-carbon composites (C—C composites) and carbon-silicon carbide composites (C—SiC composites) are not only suitable to provide robust foils with the desired strength and thermal conductivity, but are also able to withstand Sn liquid under lithographic apparatus conditions. Such materials are especially suitable in coping with ions, particles and liquid Sn particles from a Sn based source of radiation.

Uni-directional carbon-fiber composites appear to provide foils 200 which are suitable for application in the filter device 149. Carbon-fiber composite materials are known from the prior art, such as for instance from PCT Patent Application Publication No. WO 00/034629, U.S. Pat. No. 4,833,030, and U.S. Patent Application Publication Nos. US 2005/0151305, and US 2006/0019816. The term "uni-directional" refers herein to carbon fiber composite materials of the C—C or C—SiC type wherein the orientation of the carbon fibers is substantially in one direction (one orientation). This contrast with, for instance, 3D or woven type of carbon-fiber composites.

In an embodiment, the lithographic apparatus 1 comprises the filter device 149, wherein the filter device 149 comprises a plurality of foils 200 attached to holder 201 which is able to rotate around the rotation axis RA, the foils 200 being arranged parallel to the rotation axis RA, wherein the foils 200 comprise the uni-directional carbon-fiber composite material selected from the group consisting of carbon-carbon composite (C—C composite) and carbon-silicon carbide composite (C—SiC composite).

Thus, in an embodiment, the lithographic apparatus 1 comprises the filter device 149, wherein the filter device 149 comprises a plurality of foils 200 attached to holder 201 which is able to rotate around rotation axis RA, the foils 200 being arranged parallel to the rotation axis RA, wherein the foils comprise a material which does not substantially react with liquid Sn. The material, such as the herein described carbon-fiber composites, may have a thermal conductivity of at least about 50 W/mK, at least about 60 W/mK, at least about 100 W/mK, in the range of about 50-400 W/mK, in the range of about 60-400 W/mK, and/or in the range of about 100-400 W/mK. Note that this thermal behavior may be anisotropic. At least in one direction, in the direction of the orientation of the carbon fibers, the thermal conductivity may have the herein specified values.

In an embodiment, the direction of the fibers in the carbon-fiber composite material is perpendicular to the rotation axis RA. Therefore, the tensile strength of the material is may be optimally applied and the centrifugal forces may be best resisted. The tensile strength in the direction of the fibers may be in the range of 200-900 MPa, or of about 400-800 MPa.

Figure 5:
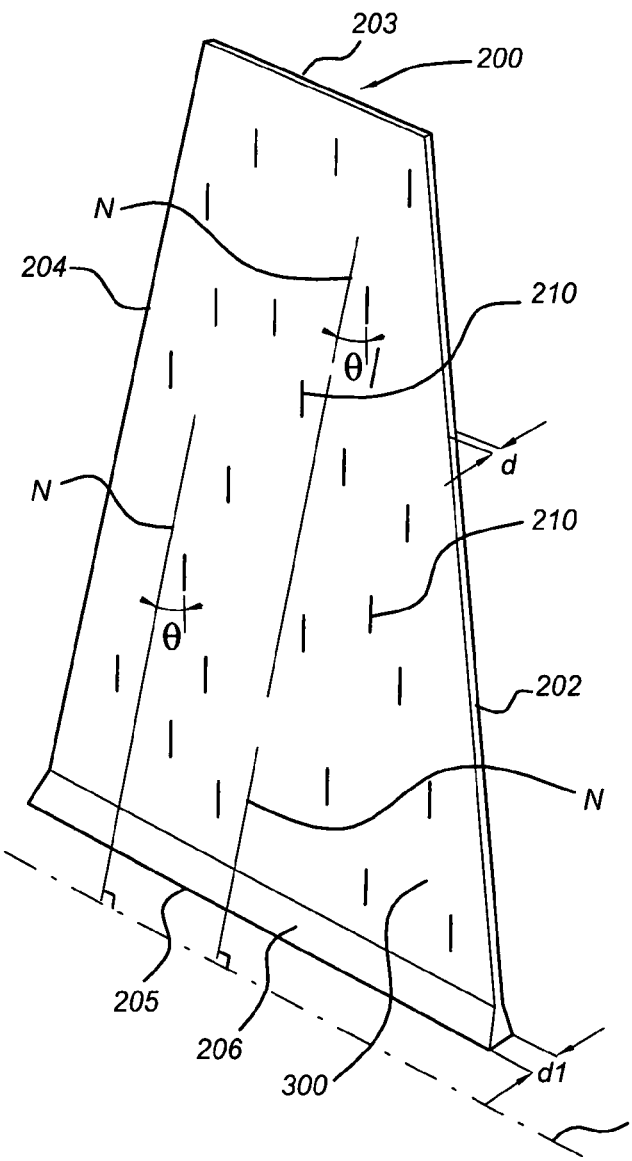
FIG. 5 schematically depicts a foil from the filter device according to an embodiment of the invention.

Referring to FIG. 5, an embodiment of a foil 200 is shown, for clarity drawn separate from the holder 201. The foil 200 may have an upstream front region 202, top region 203, downstream back region 204 and a bottom 205. Towards the bottom 205, a tail part 206 is shown, which may be relatively thicker than the main part of the foil 200. This tail part 206 may better allow attachment of the foil 200 to the holder 201. The foil 201 has a maximum thickness d, which may be in the range of about 0.05-1.2 mm, or about 0.1-0.4 mm. The tail part 206 may have a maximum thickness in the range of about 0.2-2.5 mm, or about 0.6-1.5 mm. The tail part 206 may comprise about 0.2-5% of the total surface of the foil 200. In an embodiment, the maximum thickness d1 of the tail part is larger than the maximum thickness d of the foil.

FIG. 5 schematically also depicts carbon fibers 210. The carbon fibers 210 may have an angle θ with a normal N perpendicular to the rotation axis RA. The smallest angle with the normal is selected. For clarity reasons, some of the carbon fibers 210 have been drawn as having an angle θ which is non-zero. The direction of the carbon fibers 210 is the mean value of angle θ for the carbon fibers 210 in the foil 200 (or layer comprised in the foil as discussed below). In a uni-directional carbon-fiber composite, the fibers 210 are arranged substantially parallel to each other and are arranged in substantially one direction. As mentioned above, the direction of the fibers 210 in the carbon-fiber composite material is in an embodiment perpendicular to the rotation axis RA, i.e. angle θ is substantially 0°, or in the range of 0-1°.

Figure 6A:
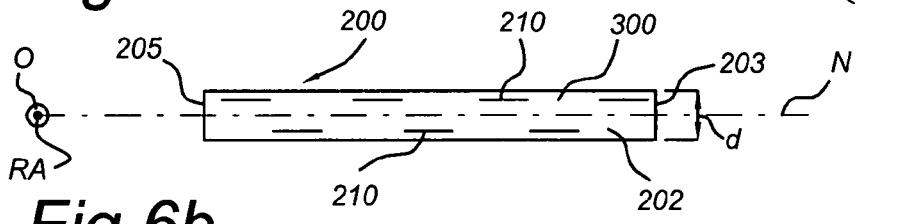
FIGS. 6a-6f schematically depict a number of arrangements of the carbon-fiber composites of the foils from the filter device according an embodiment of the invention.

FIG. 6a shows (in front view) an embodiment wherein the direction of the fibers 210 in the carbon-fiber composite material is perpendicular to the rotation axis RA, i.e. angle θ is substantially zero. For clarity reasons the tail part 206 is not shown, and only part of the foil 200 is shown. Note that schematically, the foil 200 herein is shown to have a constant thickness, however, there may be a variation in foil thickness over height or length of the foil 200, irrespective of the tail part 206. In FIG. 6a, schematically the optical axis O and rotation axis RA are shown in front view, i.e. the foil 200 of FIG. 5 is now seen from the front region 202 (upstream view). The foil in this embodiment essentially consists of one layer 300 of the carbon-fiber composite material. The fibers 210 in this embodiment are aligned parallel to the normal N (the normal perpendicular to the rotation axis RA), and (thus) perpendicular to the rotation axis RA, i.e. an angle θ with a normal N which is substantially zero.

Figure 6B:
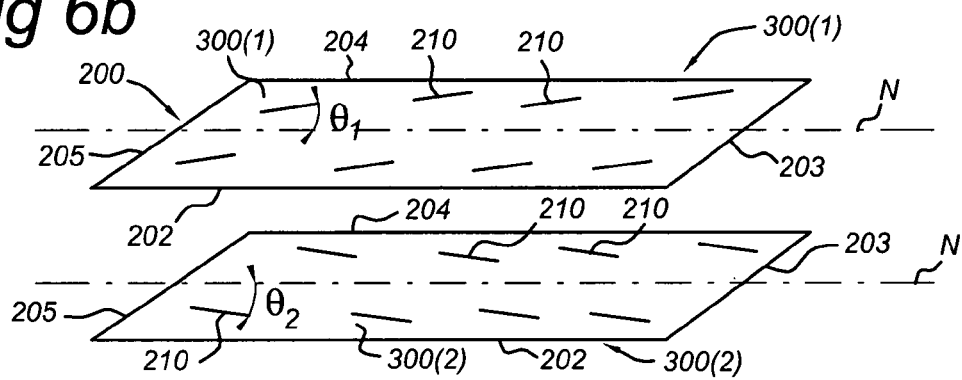

In an embodiment, the foils 200 comprise one layer 300 of uni-directional carbon-fiber composite material. However, another embodiment is possible, as schematically depicted in FIGS. 6b/6c/6d and 6e/6f (as well in FIG. 7a). The foils 200 may in an embodiment of the filter device 149 comprise 2-5 layers of composite material. In such an embodiment, the direction of the carbon fibers 210 within the respective layers may differ from layer to layer.

FIG. 6b schematically depicts an embodiment of a foil 200, comprising two layers of carbon-fiber composite material. For the sake of clarity, the layers are drawn at a distance from each other. The foil 200 comprises in this embodiment a first layer 300(1) of uni-directional carbon-fiber composite material and a second layer 300(2) of uni-directional carbon-fiber composite material. The direction of the carbon fibers 210 relative to the normal (and thus relative to the rotation axis RA (not shown)) may differ from layer to layer. In FIG. 6b, the angles with the normal N to the rotation axis RA are indicated as θ1 and θ2, respectively.

In an embodiment, not depicted, the foils 200 comprise first layer 300(1) of uni-directional carbon-fiber composite material and second layer 300(1) of uni-directional carbon-fiber composite material, wherein the direction of the fibers 210 in the first layer 300(1) is perpendicular to the direction of the fibers 210 in the second layer 300(2). When applying such a foil 200 in the filter device, in an embodiment, the direction of the fibers 210 of at least one of the layers is perpendicular to the rotation axis RA and the direction of the fibers 210 in the other layer is thus parallel to the rotation axis RA. Thus, in an embodiment, the direction of the fibers 210 in at least one of the layers is parallel to normal N, i.e. angle θ in this layer is substantially zero and perpendicular to the rotation axis RA, and the direction of the fibers 210 in at least one of the layers is perpendicular to normal N, i.e. angle θ in this layer is substantially 90°.

In an embodiment schematically depicted in FIGS. 6b/6c, a foil 200 comprises first layer 300(1) of uni-directional carbon-fiber composite material and second layer 300(2) of uni-directional carbon-fiber composite material, wherein the direction of the fibers 210 in the first layer 300(1) have a first direction angle θ1 relative to normal N perpendicular to the rotation axis RA and wherein the direction of the fibers 210 in the second layer 300(1) have a second direction angle θ2 relative to the normal N, and wherein the first and the second direction angles (θ1,θ2) are in the range of 0-10° and wherein the mutual angle between the direction of the fibers in the first layer and the second layer is larger than 0° and equal to or smaller than 10°. For instance, the direction of the carbon-fibers 210 in the first layer 300(1) may have θ1 of 0° with normal N and the direction of the carbon-fibers 210 in the second layer 300(2) may have θ1 of 2.5° with normal N, thereby providing a mutual angle of 2.5°. In another embodiment, θ1 may be 2.5° and θ2 may be 2.5°, but the mutual angle may be 5° (opposite deviations of the directions in the respective layers).

When two or more layers are applied in foil 200, in an embodiment, at least 2 layers have different directions of the carbon fibers, i.e. the carbon fibers in at least two layers are not parallel. When applying such a foil 200 with at least 2 layers in the filter device, in an embodiment, the direction of the fibers 210 of at least one of the layers is perpendicular to the rotation axis RA (i.e. angle θ with normal N is substantially zero).

Figure 6C:
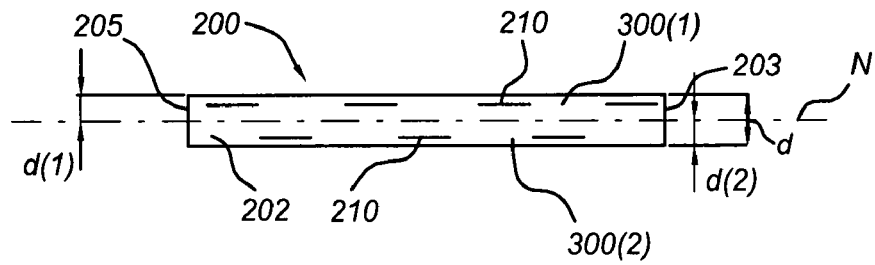
Figure 6D:
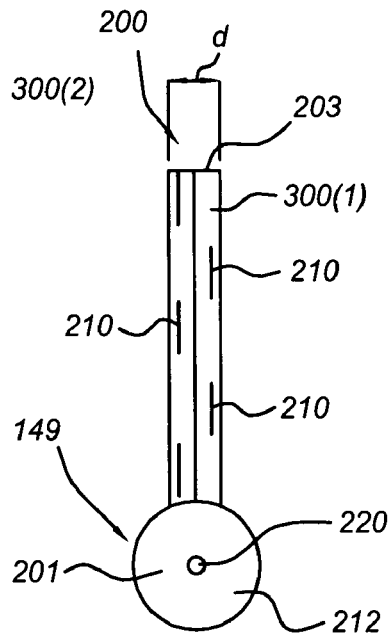

FIG. 6c schematically depicts a side view of this embodiment, wherein foil 200 comprises the two layers 300(1) and 300(2). In this schematic side view, the fibers 210 seem parallel, but are, as described above in an embodiment, not parallel. The deviation from parallelism is however in a plane perpendicular to the view. Each layer has a thickness, indicated as d(1) and d(2), respectively. FIG. 6d is a front or side view, but now schematically including the holder 201. Rotation axis RA, perpendicular to the plane of drawing, is also schematically indicated. For the sake of clarity, the filter device 149 is schematically depicted with only one foil 200.

Figure 6E:
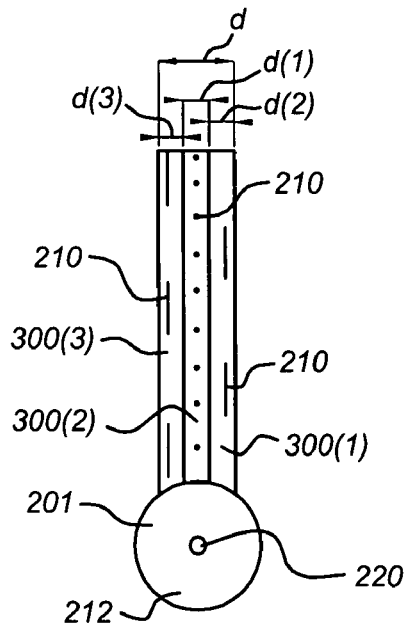

FIGS. 6e/6f schematically depict an embodiment of the foil 200, wherein the foil essentially consists of three layers, indicated with reference numbers 300(1), 300(2) and 300(3), respectively, with maximum thicknesses d(1), d(2) and d(3), respectively. The third layer 300(3) may comprise carbon-fiber composite material wherein the direction of the carbon fibers 210 is essentially parallel to the direction of the carbon fibers 210 in carbon-fiber composite material of the first layer 300(1).

In an embodiment, as schematically depicted in FIGS. 6e/6f, foil 200 comprises a first layer 300(1) of uni-directional carbon-fiber composite material, a second layer 300(2) of uni-directional carbon-fiber composite material, and a third layer 300(2) of uni-directional carbon-fiber composite material, wherein the direction of the fibers 210 in the first layer 300(1) has a first direction angle (θ1) (not depicted) relative to a normal (N) perpendicular to the rotation axis (RA), wherein the direction of the fibers 210 in the second layer 300(2) has a second direction angle (θ2) relative to the normal (N), and wherein the direction of the fibers 210 in the third layer 300(3) has a third direction angle (θ3) (not depicted) relative to the normal (N), and wherein the first, second and third direction angles (θ1,θ2,θ3) are in the range of about 0-90° and wherein the mutual angle between the direction of the fibers 210 in the first layer 300(1) and the second layer 300(2) is, in an embodiment, substantially 90° and wherein the mutual angle between the direction of the fibers 210 in the first layer 300(1) and third layer 300(3) is, in an embodiment, substantially 0°. In other words, in an embodiment, foil 200 comprises first layer 300(1) of uni-directional carbon-fiber composite material, a second layer 300(2) of uni-directional carbon-fiber composite material, and third layer 300(2) of uni-directional carbon-fiber composite material, wherein the direction of carbon fibers 210 in adjacent layers are perpendicular to each other.

Figure 6F:
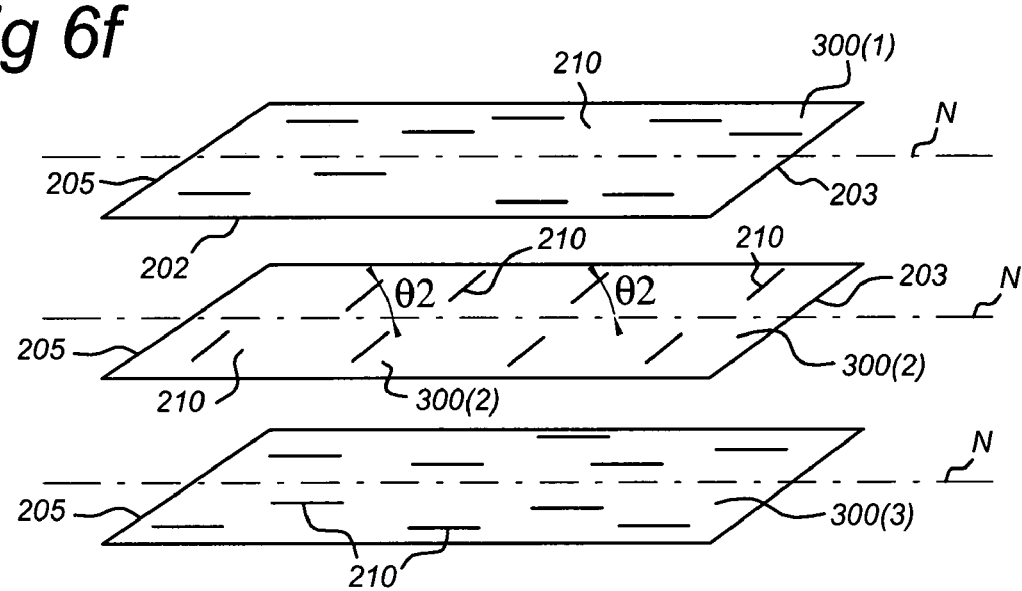

In FIG. 6f, for clarity reasons, the respective layers 300(1), 300(2) and 300(3) are schematically drawn at a distance, but as schematically drawn in FIG. 6e, the three layers 300(1), 300(2) and 300(3) form a laminate and form adjacent layers 300(1), 300(2) and 300(3). As shown in the embodiment depicted in FIG. 6e, the middle layer 300(2) has carbon fibers 210 with a direction perpendicular to the plane of the drawing (upstream view), i.e. substantially parallel to the rotation axis RA and optical axis O, which layer is sandwiched between two layers 300(1) and 300(3) with substantially parallel directions of carbon fibers 210, and which directions are perpendicular to the direction of the carbon fibers of the middle layer 300(2).

Likewise, stacks of layers, for example 2-5 layers, can be created wherein adjacent layers have carbon-fiber directions which are perpendicular to each other.

Figure 8:
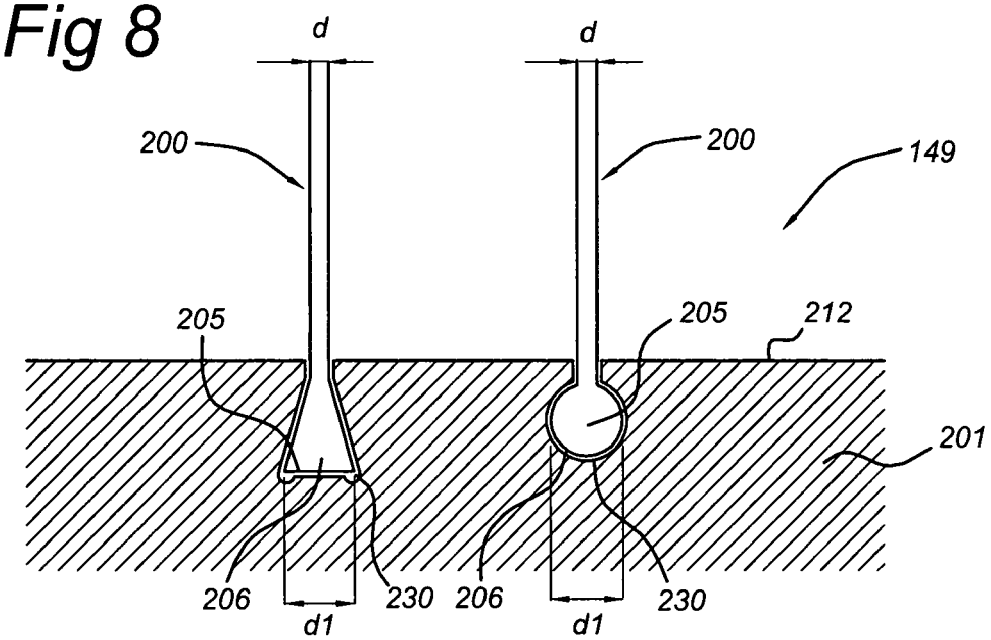
FIG. 8 schematically depicts an embodiment of the holder-foil attachment.

In an embodiment, as schematically depicted in FIG. 8, the holder 201 comprises a plurality of sleeves 230, wherein each foil 200 comprises a tail part 206, wherein the sleeves 230 are constructed to receive the tail parts 206, and wherein the sleeves 230 are constructed to prevent release of the foils 200 from the holder 201 in a direction perpendicular to the rotation axis RA. FIG. 8 schematically depicts two embodiments A and B of sleeves. As will be clear to the person skilled in the art, more types of sleeve 230 may be possible. Further, as can be understood from FIGS. 4 and 5, a plurality of sleeves 230 corresponding to the plurality of foils 200 may be present, the former arranged to host the tail parts 206 of the latter.

The holder 201 may have an external surface 212, which may at least partially be exposed to radiation of source SO during lithographic processing. In at least part of the holder 201, i.e. thus in at least part of the surface 212, sleeves 230 are arranged into which the tail part 206 can slide. They are constructed in such a way as not to allow release in a direction perpendicular to the surface 212, but only in a direction parallel to the surface 212.

In an embodiment, the foils 200 have maximum foil thickness d and the tail parts 206 have maximum tail part thickness d1, wherein the maximum tail part thickness d1 is larger than the maximum foil thickness d. The sleeves 230 may be arranged to have different widths; one closer to the surface 212, which is chosen to host part of the foil 200 with maximum thickness d, and a part further from surface 212, deeper in the holder 201, with a larger width, which width is chosen to host the tail part with maximum thickness d1, as schematically depicted in FIG. 8.

In this way, the large centrifugal forces to which the foils 200 may be exposed, may not lead to an undesired release of the foil 200. Further, the sleeves 230 and foils 200 with relatively thicker (d1>d) tail parts 206 may allow a relatively easy removal of a single foil from the filter device 149, for instance when after processing a foil 200 is damaged or when the Sn deposition on a foil 200 becomes too thick. The foil 200 may easily slide out of the holder 201 and be replaced by a new foil 200.

In an embodiment, at least part of the holder 201, especially the top 220 directed to the source SO, may comprise a carbon-fiber composite material selected from the group consisting of carbon-carbon composite (C—C composite) and carbon-silicon carbide composites (C—SiC composite). This composite may be a uni-directional carbon-fiber composite material, but may however also be a woven or knitted or 3-dimensional carbon-fiber composite material. In this way, a relatively robust filter device 149 may be provided, which is surprisingly integrally able to cope with debris such as liquid Sn, ions etc., which may be released from the source SO.

In an embodiment, the lithographic apparatus 1 comprises a source of radiation SO constructed to generate EUV radiation wherein the source of radiation SO is a Sn plasma source.

The lithographic apparatus 1 comprises in, an embodiment, an illumination system configured to condition a radiation beam; a support constructed to support a patterning device, the patterning device configured to impart the radiation beam with a pattern in its cross-section to form a patterned radiation beam; a substrate table constructed to hold a substrate; and a projection system configured to project the patterned radiation beam onto a target portion of the substrate. In an embodiment, the lithographic apparatus 1 is an EUV lithographic apparatus. The lithographic apparatus comprises a source of radiation SO constructed to generate the radiation beam, which is, in an embodiment, a EUV radiation beam, and the source of radiation is constructed to generate EUV radiation. In an embodiment, the filter device 149, during operation (e.g., lithographic processing), may rotate about optical axis O (at high speed) to filter out at least part of the debris, such as liquid Sn particles, to help diminish deposition and/or deterioration of an optical element, such as a collector mirror 50.

According to an aspect of the invention, there is provided a device manufacturing method using a lithographic apparatus 1 according to an embodiment of the invention, i.e. during lithographic processing, the filter device 149 is applied, removing by its rotation at least part of the debris ejected by source SO from the beam of radiation. A device manufacturing method may be provided, wherein, during lithographic processing, the filter device 149 rotates about rotation axis RA to filter out part of the debris emitted by source SO.

According to an aspect of the invention, there is provided a filter device 149 per se, the filter device 149 comprising a plurality of foils 200 attached to holder 201 which is able to rotate around rotation axis RA, the foils 200 being arranged parallel to the rotation axis RA, wherein the foils 200 comprise a uni-directional carbon-fiber composite material selected from the group consisting of carbon-carbon composite (C—C composite) and carbon-silicon carbide composite (C—SiC composite). As mentioned above, in an embodiment, at least part of the holder 201, especially a holder upstream side 220, may comprise a carbon-fiber composite material selected from the group consisting of carbon-carbon composite (C—C composite) and carbon-silicon carbide composite (C—SiC composite). The filter device 149 may, as will be clear to the person skilled in the art, further comprise a mechanism to propel the filter device 149, such as a motor, and may further comprise a housing, wherein the filter device 149 may rotate, a gas source configured to provide a stream of gas through the filter device 149, i.e. through the open spaces between the foils 200. The filter device 149 may further or alternatively comprise a cooling mechanism, such as a Peltier element, to cool for instance the holder 201, one or more liquid cooling media channels inside the foils 200, one or more liquid cooling media channels external to the foils 200 (such as grooves in the foils 200), liquid tin guiding structures in the foils 200 or outside the foils 200 (such as grooves in the foils 200), IR emission enhancement structures (such as structures having dimensions in the order of 5 µm to 100 µm), foil spacing structures, and spacers between adjacent foils 200 (e.g., to prevent or diminish resonances during rotation), etc.

In an aspect of the invention, there is provided a method for the production of the foils 200 for use in the filter device 149.

The production of carbon-fiber composite materials is known from the prior art, such as for instance from PCT Patent Application Publication No. WO 00/034629, U.S. Pat. No. 4,833,030, and U.S. Patent Application Publication Nos. US 2005/0151305, and US 2006/0019816. Here, an embodiment of invention provides a method for the production of a foil for a filter device, the method comprising:

a. providing a resin containing pre-impregnated sheet;
b. curing the resin;
c. optionally reducing the thickness of at least part of the product obtained at b);
d. carbonizing the product obtained at b) or c);
e. optionally performing one or more times a densifying process, wherein the densifying process comprises infiltrating the carbonized product obtained at d) with a carbon-containing compound and subsequently carbonizing the infiltrated product;
f. graphitizing the product obtained at d) or e);
g. optionally reducing the thickness of at least part of the product obtained at f) wherein the method comprises at least one process for reducing the thickness selected from the processes according to process c) and process g).

Sub processes a), b) d) and f) are standard processes. However, an embodiment of the invention further provides, in an embodiment, at least a thickness reducing process, which is either process c) or process g) or both processes c) and g). The thickness may be reduced before the carbonizing process d) or after the graphitizing process f), or after both processes b) and f). By reducing the thickness, an optimal thickness (d and d1) of the foils 200 and tail part thereof may be obtained. The thickness may be reduced by polishing or other method known in the art, such as a grinding process.

The phrase "providing a resin containing pre-impregnated sheet" refers to providing so called "prepregs" or pre-impregnated fiber reinforcement materials, known to the person skilled in the art, that after curing, carbonizing, optional densifying, and graphitizing forms (uni-directional) carbon-fiber composite material selected from the group consisting of carbon-carbon composite (C—C composite) and carbon-silicon carbide composite (C—SiC composite). Such sheets are commercially available, for instance from Toray or Nelcote.

In an embodiment, the resin containing pre-impregnated sheet comprises a laminate of resin containing pre-impregnated sheets. In such an embodiment, one starts already with a laminate of sheets and performs the above process. Such laminate of sheets may be, for instance, arranged to provide, after processing, an embodiment of foil 200 as described above and as schematically depicted in FIGS. 6b-7a.

In an embodiment, after the optional process c) and before the carbonizing process d) the method further comprises performing one or more times a laminating process, wherein the laminating process comprises:

a1. arranging a further resin containing pre-impregnated sheet to the product obtained at b) or c) to obtain a laminate of the product obtained at b) or c) and the further resin containing pre-impregnated sheet;

b1. curing the resin; and c1. optionally reducing the thickness of at least part of the product obtained at b1).

Figure 7A:
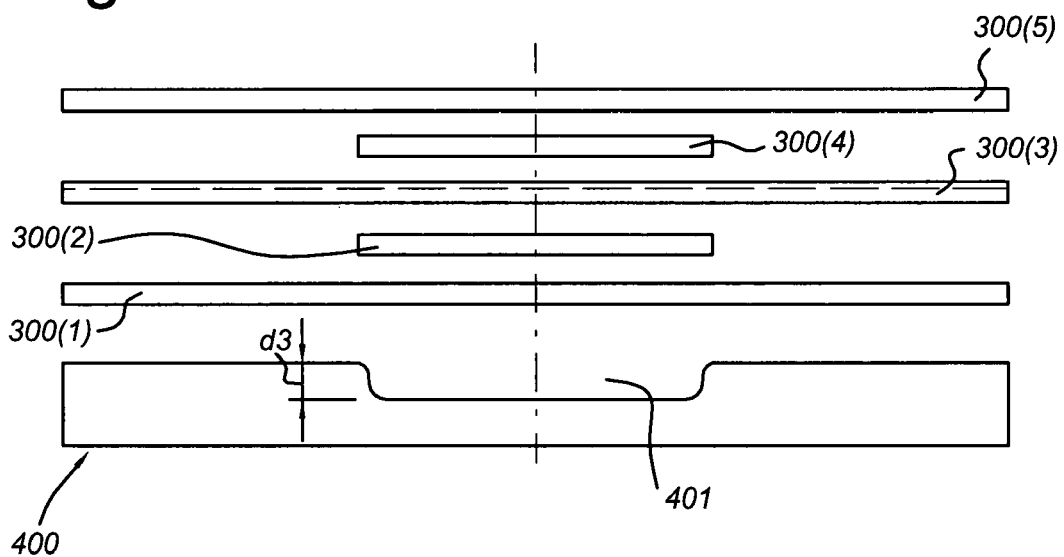
FIGS. 7a-7b schematically depict a process according to an embodiment of the invention.
Figure 7B:
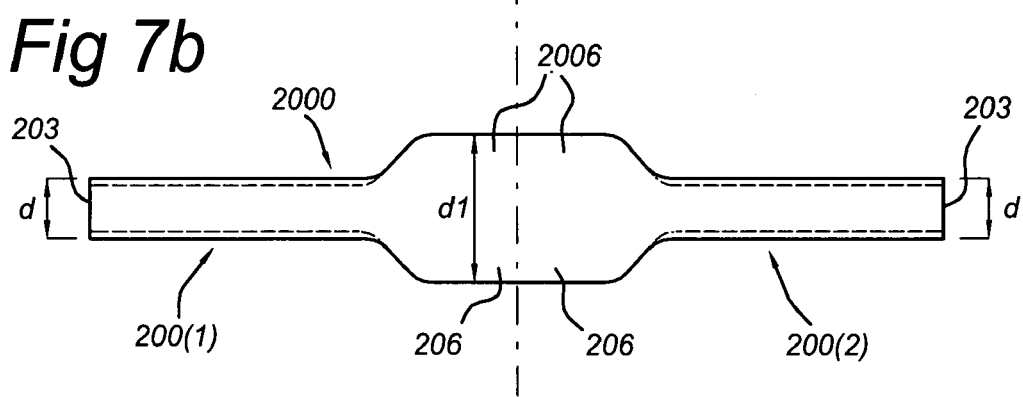

In this embodiment, laminating is performed while processing. Above described embodiments may schematically be illustrated by FIGS. 7a and 7b. FIG. 7a shows a mold 400, with a depression 401 with depth d3. In an embodiment, depth d3 is substantially equal to ½ of d. Resin containing pre-impregnated sheets are arranged on top of each other. In FIG. 7a, these sheets are indicated as sheets 300(1)-300(5). These sheets will after performing the method for the production of the foils 200 form layers 300(1)-300(5), as described above. In the embodiment schematically depicted in FIG. 7a, the sheets are laminated in a sequence of large and small sheets, in the FIG. 7a large-small-large-small-large. In this way, after performing the production method, a piece 2000 may be provided, as schematically shown in FIG. 7b. The thicker part may have a thickness corresponding to d1 and the thinner part may correspond to the foil thickness d. This piece 2000 may be divided into 2 (substantially symmetric) parts, thereby providing a first foil 200(1) and a second foil 200(2). As will be clear to the person skilled in the art, piece 2000 may have such dimensions, as to provide n*2 (substantially symmetric) parts, thereby providing n first foil 200(1) and n second foil 200(2), wherein n is for instance in the range of 1-20.

After an optional thickness reduction step and/or after an optional cutting step (thereby providing the desired shape of the foil(s) 200), the foil 200 may be ready for attachment in the holder 201 and then for application as filter device 149 in the lithographic apparatus 1.

FIG. 7a schematically shows a stack/laminate of 5 layers, however, as indicated above, 1-5 layers may be used. As mentioned above, the process may for instance be performed in such a way that first sheets 300(1)-300(3) are arranged on the mold and then cured. Then, the product obtained might be at least partially reduced in thickness, as described above and as schematically indicated in FIG. 7a with the dashed line, and then sheets 300(4)-300(5) may be applied to the cured sheets 300(1)-300(3) and also subsequently be cured. Thereafter, if desired, the obtained product may also be reduced in thickness, as in an embodiment schematically depicted in FIG. 7b with the dashed lines (i.e. process c 1). Then, after obtaining the 5-layer laminate, this product may be further processed by carbonizing and graphitizing. Thereafter, if desired, the obtained product may also be reduced in thickness.

The mold 400 is only a schematic embodiment of a possible mold.

The term "substantially" herein refers in an embodiment to "completely" or "entirely". In an embodiment, it may, for instance, refer to about 95-100%. The person skilled in the art understands the term "substantially". Likewise, the term "at least partially" herein refers in an embodiment to "completely" or "entirely". In an embodiment, it may, for instance, refer to about 95-100%.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, flat panel displays including liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it should be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein. This computer program may be used to control the removal of the deposition, control the pressures, etc.

The descriptions above are intended to be illustrative, not limiting. Thus, it will be apparent to one skilled in the art that modifications may be made to the present invention as described without departing from the scope of the claims set out below.

The present invention is not limited to application of the lithographic apparatus or use in the lithographic apparatus as described in the embodiments. Further, the drawings usually only include the elements and features that are necessary to understand the present invention. Beyond that, the drawings of the lithographic apparatus are schematic and not on scale. The present invention is not limited to those elements, shown in the schematic drawings (e.g. the number of mirrors drawn in the schematic drawings). Further, the present invention is not confined to the lithographic apparatus described in relation to FIGS. 1 and 2. It should be appreciated that embodiments described above may be combined.

What is claimed is:

1. A lithographic apparatus comprising a filter device, the filter device comprising a plurality of foils attached to a holder able to rotate around a rotation axis, the foils being arranged substantially parallel to the rotation axis and comprising a uni-directional carbon-fiber composite material selected from the group consisting of a carbon-carbon composite and a carbon-silicon carbide composite.

2. The lithographic apparatus of claim 1, wherein the direction of the fibers in the carbon-fiber composite material is transverse to the rotation axis.

3. The lithographic apparatus of claim 1, wherein the foils comprise one layer of uni-directional carbon-fiber composite material.

4. The lithographic apparatus of claim 1, wherein the foils comprise a first layer of uni-directional carbon-fiber composite material and a second layer of uni-directional carbon-fiber composite material, wherein the direction of the fibers in the first layer is transverse to the direction of the fibers in the second layer.

5. The lithographic apparatus of claim 1, wherein the foils comprise a first layer of uni-directional carbon-fiber composite material and a second layer of uni-directional carbon-fiber composite material, wherein the direction of the fibers in the first layer have a first direction angle relative to a normal perpendicular to the rotation axis and wherein the direction of the fibers in the second layer have a second direction angle relative to the normal, and wherein the first and the second direction angles are in the range of 0°-10° and wherein the mutual angle between the direction of the fibers in the first layer and the second layer is larger than 0° and equal to or smaller than 10°.

6. The lithographic apparatus of claim 1, wherein the foils comprise 2-5 layers of composite material.

7. The lithographic apparatus of claim 1, wherein the foils have a maximum foil thickness in the range of 0.05- 1.2 mm.

8. The lithographic apparatus of claim 1, wherein the foils have a maximum foil thickness in the range of 0.1- 0.4 mm.

9. The lithographic apparatus of claim 1, wherein the holder comprises a plurality of sleeves, wherein each foil comprises a tail part, wherein the sleeves are constructed to receive the tail parts and to prevent release of the foils from the holder in a direction perpendicular to the rotation axis.

10. The lithographic apparatus of claim 1, wherein the filter device comprises 50-200 foils.

11. The lithographic apparatus of claim 1, wherein at least part of the holder comprise a carbon-fiber composite material selected from the group consisting of a carbon-carbon composite and carbon-silicon carbide composite.

12. The lithographic apparatus of claim 1, further comprising a Sn plasma source of radiation constructed to generate EUV radiation.

13. A lithographic apparatus comprising a filter device, the filter device comprising a plurality of foils attached to a holder which is able to rotate around a rotation axis, the foils being arranged parallel to the rotation axis and comprising a uni-directional carbon-fiber composite material which does not substantially react with liquid Sn at a temperature of at least 1000° C.

14. A filter device comprising a plurality of foils attached to a holder which is able to rotate around a rotation axis, the foils being arranged substantially parallel to the rotation axis and comprising a uni-directional carbon-fiber composite material selected from the group consisting of carbon-carbon composite and carbon-silicon carbide composite.

15. The filter device of claim 14, wherein at least part of the holder comprise a carbon-fiber composite material selected from the group consisting of carbon-carbon composite and carbon-silicon carbide composite.

16. A method for the production of a foil for a filter device, the method comprising:
    a. providing a resin containing pre-impregnated sheet;
    b. curing the resin;
    c. optionally reducing the thickness of at least part of the product obtained at b);
    d. carbonizing the product obtained at b) or c);
    e. optionally performing one or more times a densifying process, wherein the densifying process comprises infiltrating the carbonized product with a carbon-containing compound and subsequently carbonizing the infiltrated product;
    f. graphitizing the product obtained at d) or e);
    g. optionally reducing the thickness of at least part of the product obtained at f)
    wherein the method comprises reducing the thickness by process c), or by process g), or by both process c) and g), and wherein the foil comprises a uni-directional carbon-fiber composite material selected from the group consisting of carbon-carbon composite and carbon-silicon carbide composite.

17. The method according to claim 16, wherein the resin containing pre-impregnated sheet comprises a laminate of resin containing pre-impregnated sheets.

18. The method according to claim 16, further comprising, after the process b) and before process d), performing one or more times a laminating process, wherein the laminating process comprises:
    a1. arranging a further resin containing pre-impregnated sheet to the product obtained at b) or c) to obtain a laminate of the product obtained at b) or c) and the further resin containing pre-impregnated sheet; and
    b1. curing the resin.

19. The method according to claim 18, further comprising reducing the thickness of at least part of the product obtained at b1.

20. The method according to claim 16, comprising performing process e).

21. A device manufacturing method, comprising:
    patterning a beam of radiation;
    projecting the patterned beam of radiation onto a target portion of a substrate; and
    filtering the beam of radiation using a filter device, the filter device comprising a plurality of foils attached to a holder able to rotate around a rotation axis, the foils being arranged substantially parallel to the rotation axis and comprising a uni-directional carbon-fiber composite material selected from the group consisting of a carbon-carbon composite and a carbon-silicon carbide composite.

22. The device manufacturing method of claim 21, wherein during lithographic processing, rotating the filter device about the rotation axis.

* * * * *